United States Patent [19]
Yamada et al.

[11] Patent Number: 6,002,181
[45] Date of Patent: *Dec. 14, 1999

[54] STRUCTURE OF RESIN MOLDED TYPE SEMICONDUCTOR DEVICE WITH EMBEDDED THERMAL DISSIPATOR

[75] Inventors: Etsuo Yamada; Yasushi Shiraishi; Hiroshi Kawano; Shinji Ohuchi; Hidekazu Nasu, all of Tokyo, Japan

[73] Assignee: Oki Electric Industry Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/551,917

[22] Filed: Oct. 23, 1995

[30] Foreign Application Priority Data

Nov. 8, 1994 [JP] Japan ................................. 6-273262

[51] Int. Cl.$^6$ ................................................. H01L 23/28
[52] U.S. Cl. ........................ 257/787; 257/790; 257/713; 257/718; 257/796
[58] Field of Search ................................. 257/712, 713, 257/718, 719, 796, 787, 788, 789, 790

[56] References Cited

U.S. PATENT DOCUMENTS 5,157,478  10/1992  Ueda et al. .............................. 257/796
5,391,916  2/1995  Kohno et al. .
5,442,234  8/1995  Liang ...................................... 257/718

FOREIGN PATENT DOCUMENTS

| 0-508 266 | 10/1992 | European Pat. Off. . |
|---|---|---|
| 1-007645 | 1/1989 | Japan . |
| 2-181956 | 7/1990 | Japan . |
| 2-260558 | 10/1990 | Japan . |
| 3-289163 | 12/1991 | Japan . |
| 4-245462 | 9/1992 | Japan . |
| 4-317360 | 11/1992 | Japan . |
| 4-359461 | 12/1992 | Japan . |
| A-05-315526 | 11/1993 | Japan . |
| 6-097353 | 4/1994 | Japan . |
| A-6-140542 | 5/1994 | Japan . |

*Primary Examiner*—Carl Whitehead, Jr.

[57] ABSTRACT

A resin molded type semiconductor device has an inner portion sandwiched between two outer surfaces. The device includes a chip support with a first, inwardly facing surface and a second, outwardly facing surface. The device also includes a semiconductor element with a first, inwardly facing surface and a second, outwardly facing surface. The respective first surfaces of the chip support and semiconductor element are fixed to each other. A mold resin is provided to seal the entire semiconductor device except for the respective second surfaces of the chip support and semiconductor element which remain exposed as part of the two outer surfaces of the device, in order to keep the semiconductor device thin.

12 Claims, 6 Drawing Sheets

STRUCTURE OF RESIN MOLDED TYPE SEMICONDUCTOR DEVICE WITH EMBEDDED THERMAL DISSIPATOR

BACKGROUND OF THE INVENTION

1. Field of the Invention

This invention relates to a structure of a resin molded type semiconductor device.

2. Description of the Related Art

An IC card and a memory card have been rapidly developed in recent years. With its rapid development, there has been a demand for a thin plastic or resin molded type semiconductor device mounted in the IC or memory card. A vast number of methods of making the resin molded type semiconductor device thinner have been also proposed. As one of the methods, there is known a structure of a semiconductor device disclosed in Japanese Patent Application Laid-Open No. 4-317360, for example, wherein lower surfaces of die pads are exposed without being covered with a mold resin. According to such structure, the semiconductor device can be made thin with a thickness ranging from about 0.2 mm to 0.3 mm if the entire thickness of a package is regarded as about 1.0 mm.

SUMMARY OF THE INVENTION

An object of the present invention is to cheaply provide a structure of a semiconductor device capable of preventing resin cracks from occurring, providing high reliability and making the semiconductor device thinner.

According to one aspect of the invention, for achieving the above object, there is provided a structure of a resin molded type semiconductor device. The device includes a semiconductor element having a first surface to which conductive wires are connected, and an opposite second surface. A chip support has a first surface fixed to the first surface of the semiconductor element at a portion of the first surface of the semiconductor element at which the conductive wires are not connected. The respective first surfaces face toward the interior of the device, whereas the respective second surfaces face outwardly. A mold resin is provided for sealing the entire semiconductor device except for the respective second surfaces of the semiconductor element and the chip support, which second surfaces remain exposed.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
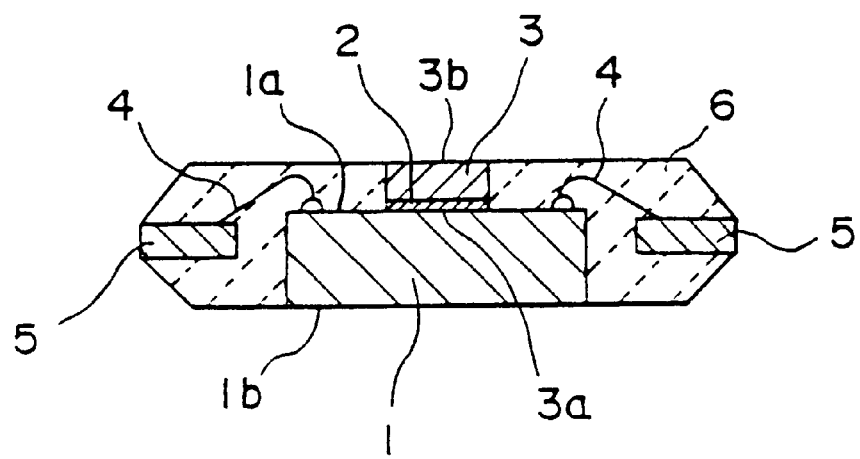
FIG. 1 is a vertical sectional side view of a resin molded type semiconductor device showing a first embodiment of the present invention.

FIG. 1 is a schematic cross-sectional view showing a first embodiment of a plastic or resin molded type semiconductor device according to the present invention. In FIG. 1, the semiconductor device comprises a semiconductor element 1 in which circuits are formed on the surface of silicon, a chip support 3 having an inwardly facing surface 3a fixed to an opposed, inwardly facing surface 1a of the semiconductor element 1 with an adhesive tape 2, leads 5 respectively electrically connected to A1 pads (bonding pads) formed on the surface 1a of the semiconductor element 1 through gold wires (bonding wires) 4, and a mold resin 6 that seals the entire semiconductor device except for respective outwardly facing surfaces 1b of semiconductor element 1 and 3b of chip support 3, as explained below. The chip support 3 serves so as to reinforce the semiconductor element 1.

In this type of structure, the chip support 3 is provided so as to avoid areas or portions where the gold wires 4 are disposed and extend in the longitudinal direction of the semiconductor element 1 substantially along the center of the semiconductor element 1. Further, the chip support 3 is disposed so as to extend between substantially both ends of the semiconductor element 1. Upon sealing the semiconductor device with the mold resin 6, a structure is achieved in which the outwardly facing surface 3b of chip support 3 and the outwardly facing surface 1b of semiconductor element 1 remain respectively exposed when the semiconductor device is sealed with the mold resin 6.

A method of manufacturing the resin molded type semiconductor device shown in FIG. 1 will now be described.

The chip support 3 is tightly disposed and fixed onto the semiconductor element 1 supported by an unillustrated support with the adhesive tape 2 interposed therebetween. In this case, the semiconductor element 1 and the chip support 3 are fixed to each other with an adhesive or an adhesive tape. The time required to dry the adhesive is spent when they are fixed to each other with the adhesive. On the other hand, when they are fixed to one another with the adhesive tape 2, drying becomes unnecessary.

Next, the unillustrated A1 pads formed on the semiconductor element 1 and the leads 5 are respectively electrically bonded to one another by the gold wires 4.

Thereafter, the entire semiconductor device from which parts of the leads 5 are eliminated, is sealed with the mold resin 6.

Finally, the resin molded type semiconductor device can be obtained by cutting and bending the leads 5 which project from the mold resin 6.

Thus, in the resin molded type semiconductor device according to the first embodiment of the present invention, the outwardly facing surface 1b located on the side opposite to the surface 1a of the semiconductor element 1, and the outwardly facing surface 3b of the chip support 3 located on the side opposite to the surface 3a of the chip support 3, which is bonded to the semiconductor element 1, remain exposed when the semiconductor device 6 is sealed with the mold resin 6. Therefore, the thickness of a package can be reduced to a size obtained by simply adding the thicknesses of the semiconductor element 1, the adhesive tape 2 and the chip support 3 together, thereby making it possible to thin the semiconductor device. Since the distribution of the mold resin 6 is averaged, warpage of the semiconductor device, which occurs due to heat shrinkage, is hardly generated and the stress applied to the incorporated semiconductor element 1 can be also reduced.

Figure 2:
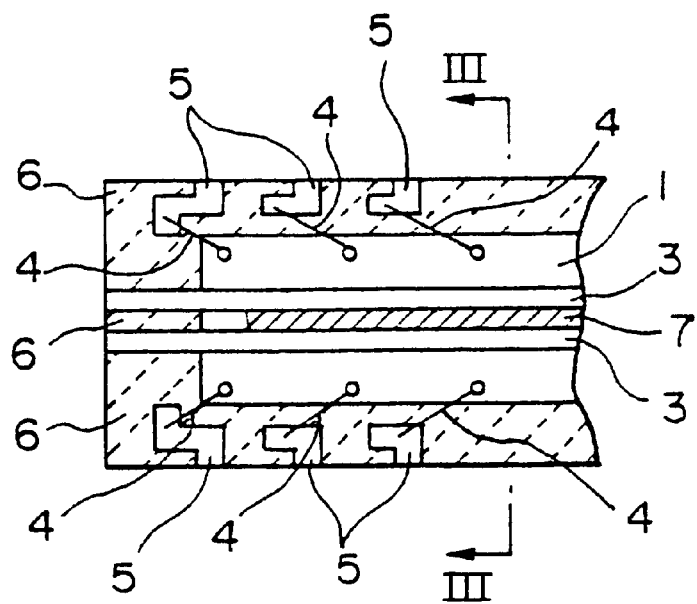
FIG. 2 is a fragmentary plan view of a resin molded type semiconductor device illustrating a second embodiment of the present invention.
Figure 3:
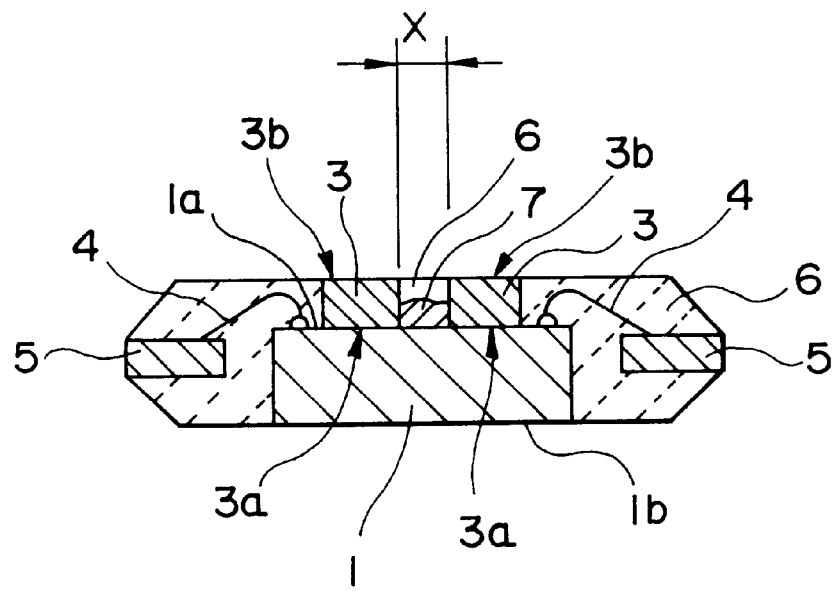
FIG. 3 is an enlarged vertical sectional side view taken along line III—III of FIG. 2.

FIGS. 2 and 3 illustrate a second embodiment of a resin molded type semiconductor device according to the present invention. FIG. 2 is a fragmentary plan view of the second embodiment. FIG. 3 is a schematic enlarged sectional view taken along line A—A of FIG. 2. In FIGS. 2 and 3, elements of structure indicated by reference numerals identical to those shown in FIG. 1 show the same ones as those shown in FIG. 1.

The semiconductor device comprises a semiconductor element 1 in which circuits are formed on the surface of silicon, a pair of chip supports 3 and 3 having surfaces 3a affixed to a surface 1a of the semiconductor element 1 with an adhesive 7, leads 5 respectively electrically connected to A1 pads (bonding pads) formed on a surface 1a of the semiconductor element 1 through gold wires (bonding wires) 4, and a mold resin 6 that seals the entire semiconductor device except for outwardly facing surface 1b of semiconductor element 1 and outwardly facing surface 3b of chip supports 3 and 3. The pair of chip supports 3 and 3 serve to reinforce the semiconductor element 1.

In this type of structure, an interval x is defined between the pair of chip supports 3 and 3. The chip supports 3 and 3 are provided so as to avoid areas or portions where the gold wires 4 are disposed, and extend in the longitudinal direction of the semiconductor element 1 substantially along the center of the semiconductor element 1. Further, the pair of chip supports 3 and 3, and the pair of chip supports 3 and 3 and the semiconductor element 1 are respectively fixed to one another with the adhesive 7 injected into the interval x. Upon sealing the semiconductor device with the mold resin 6, a structure is achieved wherein the outwardly facing surface 1b located on the side opposite to the surface 1a of the semiconductor element 1, and outwardly facing surface 3b located on the side opposite to the surface 3a of the chip support 3, which is bonded to the semiconductor element 1, remain respectively exposed when the semiconductor device is sealed with the mold resin 6.

A method of manufacturing the resin molded type semiconductor device shown in FIGS. 2 and 3 will further be described. Firstly, the chip supports 3 are tightly placed on the semiconductor element 1 supported by an unillustrated support and are arranged in parallel to each other with the interval x defined therebetween.

Next, parts of both ends extending in the longitudinal direction of the semiconductor element 1 are left and the interval x is filled up with the adhesive 7. Thus, the pair of chip supports 3 and 3 and the semiconductor element 1 are brought into a tacked state.

The unillustrated A1 pads are formed on the semiconductor element 1 and the leads 5 are then electrically bonded to each other by the gold wires 4.

Thereafter, the mold resin 6 is injected with a part in the interval x, which is unfilled with the adhesive 7 as a mold injection port. Thus, the entire semiconductor device from which parts of the leads 5 are eliminated, except for outwardly facing surface 1b of the semiconductor element 1 and outwardly facing surfaces 3b of the chip supports 3 and 3, is sealed with the mold resin 6. In this case, the mold resin 6 flows into the upper side of the adhesive 7 already charged into the interval x and hence the pair of chip supports 3 and 3 and the semiconductor element 1 are brought into a bonded state.

A final resin molded type semiconductor device is obtained by finally effecting cutting/bending processing on the leads 5 that project from the mold resin 6.

Thus, in the resin molded type semiconductor device according to the second embodiment of the present invention, the outwardly facing surface 1b located on the side opposite to the surface 1a of the semiconductor element 1, and the outwardly facing surface 3b of the chip support 3 located on the side opposite to the surface 3a of the chip support 3, which is bonded to the semiconductor element 1, remain exposed when the semiconductor device is sealed with the mold resin 6. Therefore, the thickness of a package can be reduced to a size obtained by simply adding the thicknesses of the semiconductor element 1 and the chip support 3 together, thereby making it possible to thin the semiconductor device. Since the distribution of the mold resin 6 is averaged, warpage of the semiconductor device, which occurs due to heat shrinkage, is hardly generated and the stress applied to the incorporated semiconductor element 1 can be also reduced.

Further, since the structure is adopted wherein the mold resin 6 is injected with the part in the interval x unfilled with the adhesive 7 as the mold injection port and the entire semiconductor device from which the parts of the leads 5 are eliminated, is sealed with the mold resin 6, the mold resin 6 flows into the upper side of the adhesive 7 already poured into the interval x and hence the pair of chip supports 3 and 3 and the semiconductor element 1 are firmly bonded to one another.

Figure 4:
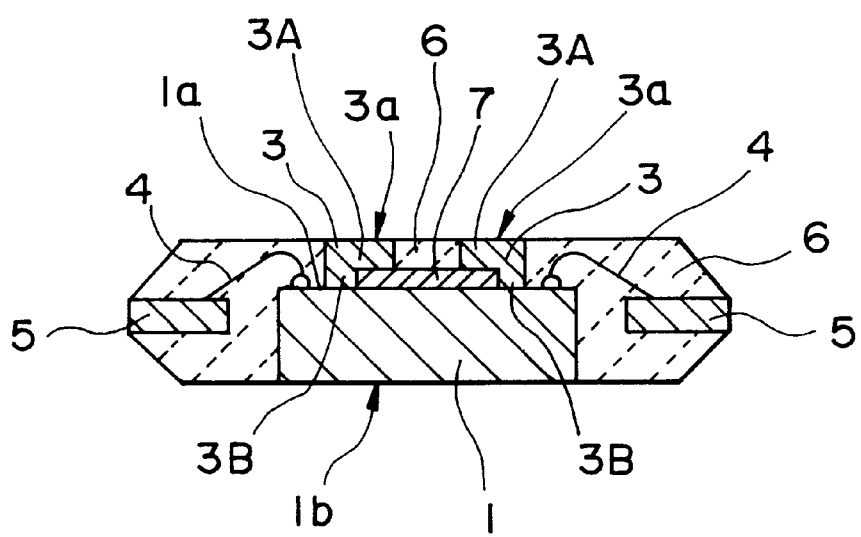
FIG. 4 is a vertical sectional side view depicting a modification of the second embodiment of the present invention.

FIG. 4 is a schematic sectional view of a resin molded type semiconductor device showing one modification of the second embodiment of the present invention. In FIG. 4, elements of structure identified by reference numerals identical to those shown in FIGS. 2 and 3 show the same ones as those shown in FIGS. 2 and 3.

In the illustrated modification, the pair of chip supports 3 and 3 have cut-away portions, respectively. Further, the chip supports 3 respectively have horizontal and vertical portions 3A and 3B and are substantially L-shaped in cross-section. The pair of chip supports 3 and 3 are disposed on the semiconductor element 1 in a state in which tips of the horizontal portions 3A are opposed to each other. Further, an interval is defined between each horizontal portion 3A and the semiconductor element 1 so as to be filled with an adhesive 7 and a mold resin 6, so that an area that contributes to bonding is increased.

Thus, the structure of this modification can bring about advantageous effects that the bonding between the pair of chip supports 3 and 3 and the semiconductor element 1 is made firmer, as well as advantageous effects obtained by the structure shown in FIGS. 2 and 3.

Figure 5:
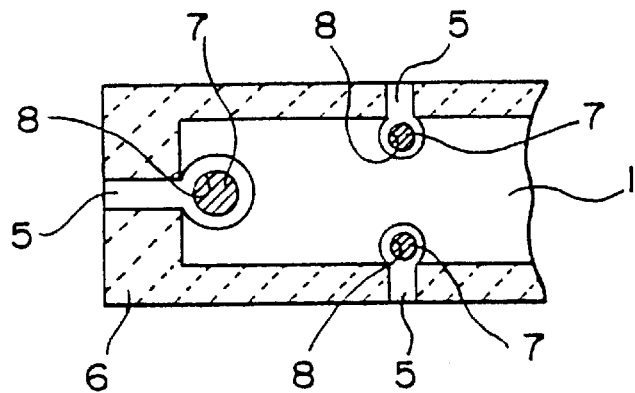
FIG. 5 is a fragmentary plan view of a resin molded type semiconductor device depicting a third embodiment of the present invention.

FIG. 5 is a fragmentary plan view showing a third embodiment of a resin molded type semiconductor device according to the present invention. In FIG. 5, elements of structure indicated by reference numerals identical to those shown in FIGS. 1 through 4 show the same ones as those illustrated in FIGS. 1 through 4.

The semiconductor device shown in FIG. 5 includes a semiconductor element 1 in which circuits are formed on the surface of silicon, and a plurality of chip supports 3 (now shown) tightly placed on a surface of the semiconductor element 1 and fixed thereto with an adhesive 7. Further, the semiconductor device has leads respectively electrically connected to unillustrated Al pads (bonding pads) formed on one side or surface of the semiconductor element 1 through gold wires (bonding wires). Furthermore, the entire semiconductor device is, except for respective outwardly facing surfaces of semiconductor element 1 and chip supports 3, sealed with a mold resin 6.

In this structure, adhesive injection holes 8 are respectively defined in tips of the chip supports 3. The individual chip supports 3 are tightly placed on an inwardly facing surface of the semiconductor element 1. Further, the adhesive 7 is injected through the adhesive injection holes 8 so as to bond between the chip supports 3 and the semiconductor element 1. The chip supports 3 serve as reinforcing materials for the semiconductor element 1. Upon sealing the semiconductor device with the mold resin 6, as in the embodiments shown in FIGS. 1–4, a structure is achieved in which the respective outwardly facing surfaces of chip supports 3 remain respectively exposed when the semiconductor device is sealed with the mold resin 6.

Therefore, the thickness of a package can be reduced to a size obtained by simply adding the thicknesses of the semiconductor element 1 and the chip supports 3 together, thereby making it possible to thin the semiconductor device. Since the mold resin 6 is distributed on the average, warpage of the semiconductor device, which occurs due to heat shrinkage, is hardly produced and the stress applied to the incorporated semiconductor element 1 can be also reduced.

Figure 6:
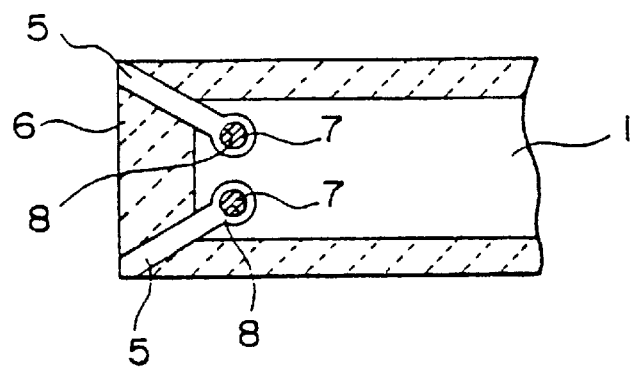
FIG. 6 is a vertical sectional side view illustrating a modification of the third embodiment of the present invention.

FIG. 6 is a schematic sectional view of a resin molded type semiconductor device showing as one modification of the third embodiment according to the present invention. In FIG. 6, elements of structure indicated by reference numerals identical to those shown in FIGS. 1 through 5 show the same ones as those shown in FIGS. 1 through 5.

In the illustrated modification, chip supports 3 (now shown) having adhesive injection holes 8 defined in tips thereof extend from the four corners (substantially symmetrical as seen from left to right side although only about the half of the semiconductor device is shown in FIG. 6) of a semiconductor element 1 so as to avoid areas or portions where gold wires (not shown) are provided. The chip supports 3 have inwardly facing surfaces that are bonded to an inwardly facing surface of the semiconductor element 1 with an adhesive 7 injected through the adhesive injection holes 8. The present embodiment is identical in structure to the third embodiment in that the chip supports 3 are used as reinforcing materials for the semiconductor element 1 and other features exist.

Figure 7:
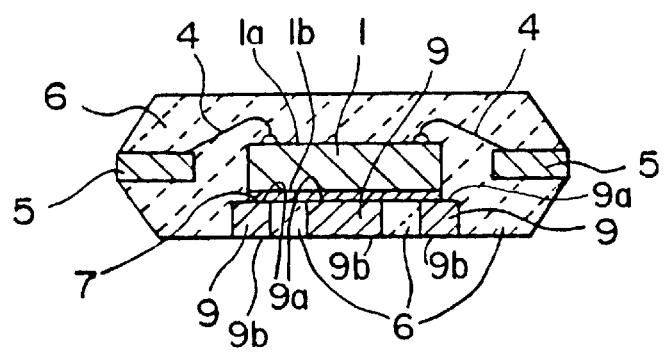
FIG. 7 is a vertical sectional side view of a resin molded type semiconductor device showing a fourth embodiment of the present invention.
Figure 8:
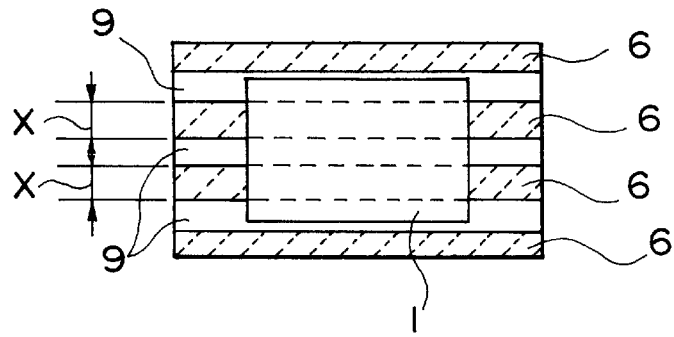
FIG. 8 is a horizontal sectional view showing the resin molded type semiconductor device according to the fourth embodiment.

FIGS. 7 and 8 show a fourth embodiment of a resin molded type semiconductor device according to the present invention. FIG. 7 is a schematic vertical sectional side view of the fourth embodiment. FIG. 8 is a schematic horizontal sectional view of the fourth embodiment. In FIGS. 7 and 8, elements of structure indicated by reference numerals identical to those shown in FIGS. 1 through 6 show the same ones as those shown in FIGS. 1 through 6.

Referring to FIGS. 7 and 8, the semiconductor device comprises a semiconductor element 1 in which circuits are formed on the surface of silicon, three die pads 9 having surfaces 9a which are placed close to each other on a surface 1b of the semiconductor element 1 and fixed thereto with an adhesive 7, leads 5 respectively electrically connected to Al pads (bonding pads) formed on a surface 1a of the semiconductor element 1 through gold wires (bonding wires) 4, and a mold resin 6 that seals the entire semiconductor device except for the outwardly facing surfaces 9b of the die pads 9. The three die pads 9 serve so as to reinforce the semiconductor element 1.

In this type of structure, the three die pads 9 extend in the longitudinal direction of the semiconductor device with intervals x defined therebetween. Further, the three die pads 9 are disposed so as to extend between substantially both ends of the semiconductor element 1. The adhesive 7 is poured into the intervals x between the die pads 9 and the semiconductor element 1. Upon sealing the semiconductor device with the mold resin 6, a structure is achieved in which the outwardly facing surfaces 9b located on the side opposite to the inwardly facing surfaces 9a of each die pad 9, which are bonded to the semiconductor element 1, remain exposed after the semiconductor device is sealed with the mold resin 6.

A method of manufacturing the resin molded type semiconductor device shown in FIGS. 7 and 8 will further be described. The semiconductor element 1 is first placed on the three die pads 9 supported by an unillustrated support and provided in parallel to each other with the intervals x defined therebetween so as to extend across the three die pads 9. Further, the semiconductor element 1 is tightly fixed to the die pads 9 with the adhesive 7 so as to temporarily affix between the die pads 9 and the semiconductor 1.

Next, the unillustrated Al pads formed on the semiconductor element 1 and the leads 5 are electrically bonded to each other through the gold wires 4.

Thereafter, the intervals x are filled with the mold resin 6. Thus, the entire semiconductor device from which parts of the leads 5 are eliminated, is sealed with the mold resin 6. In this case, the mold resin 6 also flows into each interval x defined between the adjacent divided die pads 9.

The leads 5 that project from the mold resin 6, are finally bent so as to obtain a final resin molded type semiconductor device.

Thus, in the resin molded type semiconductor device shown as the fourth embodiment of the present invention, the outwardly facing surface of each die pad 9 element is exposed after the semiconductor device is sealed with the mold resin 6. Therefore, the thickness of a package can be reduced, thus making it possible to thin the semiconductor device. Since the mold resin 6 is poured into each interval x defined between the adjacent divided die pads 9 and hence the distribution of the mold resin 6 is averaged, warpage of the semiconductor device, which occurs due to heat shrinkage, is hardly generated and the stress applied to the incorporated semiconductor element 1 can be also reduced.

Figure 9:
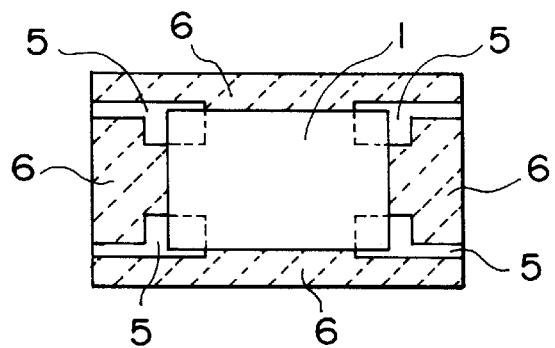
FIG. 9 is a horizontal side view illustrating a modification of the fourth embodiment of the present invention.

FIG. 9 is a schematic sectional view of a resin molded type semiconductor device showing one modification of the fourth embodiment according to the present invention. In FIG. 9, elements of structure indicated by reference numerals identical to those shown in FIGS. 1 through 8 show the same ones as those shown in FIGS. 1 through 8.

In the present modification, four die pads 9 are used. The four die pads 9 extend from the four corners of a semiconductor element 1 and are bonded to one surface 1b of the semiconductor element 1 with an adhesive 7. In regard to other points, the present modification is identical in structure to the fourth embodiment.

Figure 10:
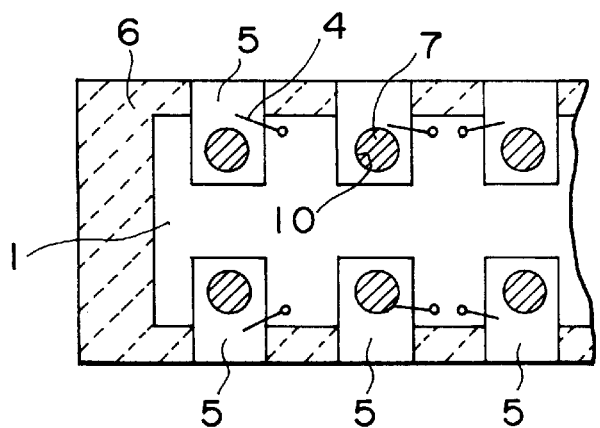
FIG. 10 is a horizontal sectional view of a resin molded type semiconductor device illustrating a fifth embodiment of the present invention.

FIG. 10 illustrates a fifth embodiment of a resin molded type semiconductor device according to the present invention. FIG. 10 is a schematic horizontal sectional view of the fifth embodiment. In FIG. 10, elements of structure designated at reference numerals identical to those shown in FIGS. 1 through 9 show the same ones as those shown in FIGS. 1 through 9.

Referring to FIG. 10, the semiconductor device is of a semiconductor device having a LOC (Lead On Chip) structure. The semiconductor device comprises a semiconductor element 1 in which circuits are formed on the surface of silicon, a plurality of leads 5 which are tightly placed on one surface 1a of the semiconductor element 1 with adhesive injection holes 10 defined in tips thereof and are respectively fixed onto the whole surface of the semiconductor element 1 with an adhesive 7 injected into the adhesive injection holes 10, gold wires (bonding wires) for respectively connecting Al pads (bonding pads) formed on one side of the semiconductor element 1 and the leads 5 to one another, and a mold resin 6 that seals the entire semiconductor device. The leads 5 tightly stuck to the semiconductor element 1 serve as for reinforcement.

A method of fabricating the resin molded type semiconductor device shown in FIG. 10 will be further described. The leads 5 are first located in predetermined positions of one surface 1a of the semiconductor element 1 and the adhesive 7 is injected through the adhesive injection holes 10 so as to temporarily affix the semiconductor element 1 and the leads 5. Next, the unillustrated Al pads formed on the semiconductor element 1 and the leads 5 are electrically bonded to one another by the gold wires 4.

Thereafter, the mold resin 6 is poured so as to seal the entire semiconductor device from which parts of the leads 5 and the outwardly facing surface of semiconductor element 1 are excluded.

Finally, the leads 5 that project from the mold resin 6, are cut and bent so as to obtain a final resin molded type semiconductor device.

Thus, since the resin molded type semiconductor device shown as the fifth embodiment has a structure in which the leads 5 having the adhesive injection holes 10 respectively defined in the tips thereof are tightly placed on one surface 1a of the semiconductor element 1, the semiconductor element 1 and the leads 5 are bonded to one another with the adhesive 7 poured through the adhesive injection holes 10 and thereafter the semiconductor device is sealed with the mold resin 6, the electrical connection between the semiconductor element 1 and the leads 5 can be made without using an adhesive tape and hence the cost of processing the adhesive tape can be reduced.

Figure 11:
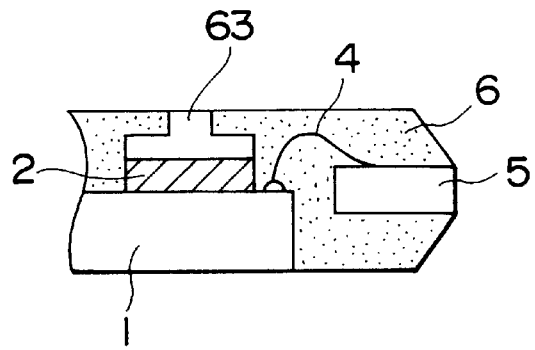
FIG. 11 is a sectional view of a resin molded type semiconductor device illustrating a sixth embodiment of the present invention.

FIG. 11 is a schematic enlarged sectional view showing a sixth embodiment of a resin molded type semiconductor device according to the present invention. In FIG. 11, elements of structure indicated by reference numerals identical to those shown in FIG. 1 show the same ones as those shown in FIG. 1.

In the sixth embodiment, a projection is formed on the surface of the chip support 63 opposite to the surface thereof bonded to the chip, which is bonded to the upper surface of the semiconductor element 1 employed in the first embodiment. FIG. 11 shows the case where a chip support 63 having a convex cross-section is used as one example of the projection. A method of fabricating the resin molded type semiconductor device according to the sixth embodiment is identical to the method of manufacturing the semiconductor device according to the first embodiment. A convex sectional form of the chip support 63 can be formed by effecting halfetching on the same chip support as that employed in the first embodiment. Owing to the shaping of the cross-section of the chip support in the form of the convex, an interface surface between the chip support and a mold resin can be made longer and the adhesion therebetween can be improved when the semiconductor element 1 and the chip support 63 are sealed with the mold resin. It is therefore possible to prevent moisture from entering from the outside.

Figure 12:
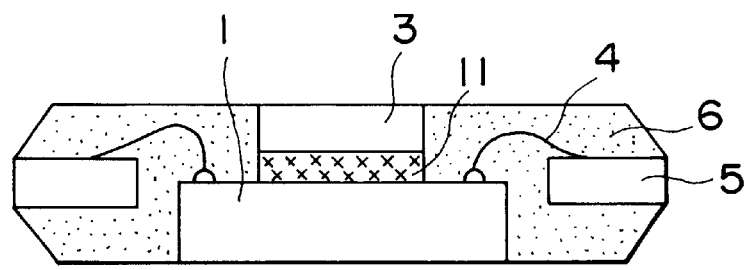
FIG. 12 is a sectional view of a resin molded type semiconductor device showing a seventh embodiment of the present invention.
Figure 13:
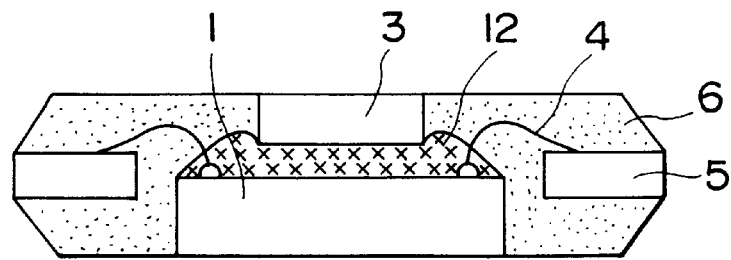
FIG. 13 is a sectional view of a resin molded type semiconductor device depicting an eighth embodiment of the present invention.

FIGS. 12 and 13 are respectively schematic enlarged sectional views showing seventh and eighth embodiments of resin molded type semiconductor devices according to the present invention. In FIGS. 12 and 13, elements of structure indicated by reference numerals identical to those shown in FIG. 1 show the same ones as those shown in FIG. 1.

The seventh embodiment shown in FIG. 12 is identical in manufacturing method to the first embodiment. As an adhesive for bonding a chip support 3 formed on an upper surface of a semiconductor element 1 to a semiconductor element 1, a rubber-like adhesive having a Young's modulus of about 10 kg/mm$^2$ is used. The adhesive 11 is formed by being applied to the upper surface of the semiconductor element 1 during a manufacturing operation. In the eighth embodiment shown in FIG. 13, an adhesive 12 is of a tape-like one and is bonded to a chip support 3 in advance. The tape-like adhesive 12 also has a Young's modulus of about 10 kg/mm$^2$ in a manner similar to the rubber-like adhesive 11 employed in the seventh embodiment.

When elastic adhesives are used as the adhesives provided between the semiconductor elements 1 and the chip supports 3 as in the case of the seventh and eighth embodiments respectively, the adhesives serve as cushioning materials even if a mold is brought into contact with the reverse side of the chip support 3 or the semiconductor element 1 upon mold clamping under resin sealing, so that a large force is prevented from applying to the semiconductor element 1 and the chip support 3. It is therefore possible to prevent cracks from occurring in the reverse side of the semiconductor element 1.

Figure 14:
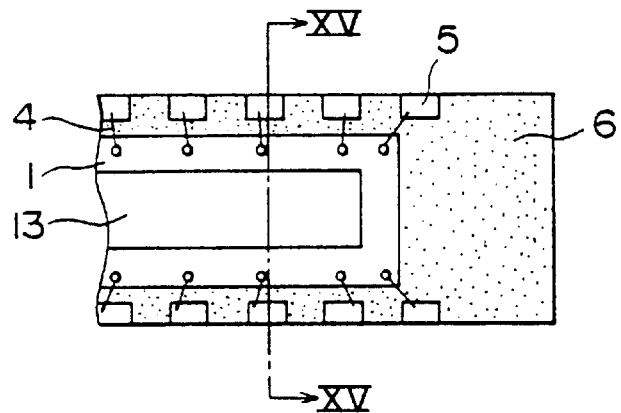
FIG. 14 is a fragmentary plan view of a resin molded type semiconductor device showing a ninth embodiment of the present invention.
Figure 15:
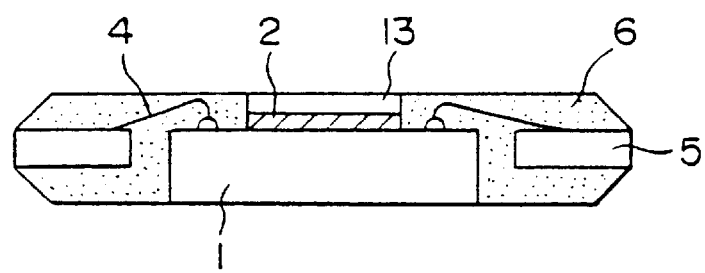
FIG. 15 is an enlarged vertical sectional side view taken along line XV—XV of FIG. 14.

FIGS. 14 and 15 illustrate a ninth embodiment of a resin molded type semiconductor device according to the present invention. FIG. 14 is a fragmentary plan view of the resin molded type semiconductor device. FIG. 15 is a schematic enlarged sectional view taken along line A—A of FIG. 2. In FIGS. 14 and 15, elements of structure indicated by reference numerals identical to those shown in FIG. 1 show the same ones as those shown in FIG. 1.

In the resin molded type semiconductor device according to the ninth embodiment, a metal plate 13 is bonded onto an upper surface of a semiconductor element 1. In the ninth embodiment as well, a mold is brought into direct contact with an upper surface of the metal plate 13 and a lower surface of the semiconductor element 1 and interposed therebetween upon mold clamping under resin sealing. Accordingly, the vertical dimension of the mold is substantially determined by the metal plate 13 and the semiconductor element 1. Since the metal plate 13 is provided separately from leads, the metal plate 13 can be formed so as to become thinner than each of leads. It is therefore possible to make the entire semiconductor device thinner. Assuming now that the thickness of the metal plate 13 is 0.1 mm, the thickness of an adhesive tape 2 is 0.1 mm and the thickness of the semiconductor element 1 is 0.3 mm, an ultra-thin semiconductor device whose entire thickness is 0.5 mm can be achieved.

Since the metal plate 13 is independent of the leads, the metal plate 13 can utilize a material different from that used for the leads. The thermal resistance of the semiconductor device can be lowered by using, for example, a high-radiative material such as Cu, Al, Cu/W or the like as the material.

Figure 16:
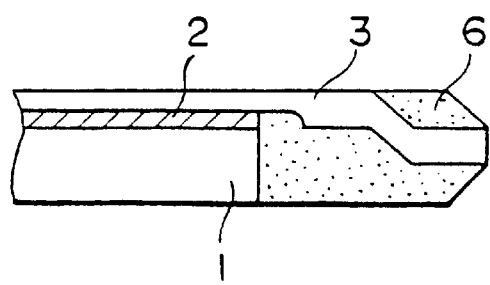
FIG. 16 is a sectional view of a resin molded type semiconductor device illustrating a tenth embodiment of the present invention.

FIG. 16 is a schematic enlarged sectional view illustrating a tenth embodiment of a resin molded type semiconductor device according to the present invention. In FIG. 16, elements of structure indicated by reference numerals identical to those shown in FIG. 1 show the same ones as those shown in FIG. 1.

The tenth embodiment shown in FIG. 16 is identical in manufacturing method to the first embodiment. However, the form of a chip support 3 formed on and bonded to an upper surface of a semiconductor element 1 is different from that of the chip support 3 employed in the first embodiment. Namely, the chip support 3 is half-etched and an adhesive tape is provided within a half-etched area thereby to bond the chip support 3 to the semiconductor element 1. By half-etching the portion of the chip support 3, which is bonded to the semiconductor element 1 as described above, the thickness of the entire semiconductor device can be made thin by a thickness corresponding to the amount of halfetching.

While the present invention has been described with reference to the illustrative embodiments, this description is not intended to be construed in a limiting sense. Various modifications of the illustrative embodiments, as well as other embodiments of the invention, will be apparent to those skilled in the art with reference to this description. It is therefore contemplated that the appended claims will cover any such modifications or embodiments as fall within the true scope of the invention.

What is claimed is:

1. A structure of a resin molded type semiconductor device having an interior sandwiched between two outer surfaces, comprising:
    a semiconductor element having a first, inwardly facing surface with a plurality of electrode pads thereon, and a second, outwardly facing surface;
    a pair of chip supports each having a first, inwardly facing surface fixed to said first surface of the semiconductor element at portions of said first surface of said semiconductor element other than at said electrode pads, and a second, outwardly facing surface;
    an adhesive injected between said pair of chip supports, for fixing said pair of chip supports and said semiconductor element to each other; and
    a mold resin for sealing the entire semiconductor device except for said second surface of said semiconductor element and said second surface of each of said pair of chip supports, respectively, which second surfaces remain exposed.

2. A structure according to claim 1, wherein said chip supports each comprise horizontal and vertical portions integrally provided so as to be substantially L-shaped in cross section, and wherein said chip supports are fixed to said semiconductor element such that tips of the horizontal portions of said chip supports are disposed face-to-face with each other.

3. A structure of a resin molded type semiconductor device having an interior sandwiched between two outer surfaces, comprising:
    a semiconductor element having a first, inwardly facing surface with a plurality of electrode pads thereon, and a second, outwardly facing surface;
    a plurality of chip supports each having an adhesive injection hole defined in a tip thereof and vertically extending therethrough, each of the tips being disposed on said first surface of said semiconductor element and extending therefrom in plural directions at portions of said semiconductor element other than at said electrode pads, and each having a first, inwardly facing surface bonded to said first surface of said semiconductor element with adhesive injected through the adhesive injection holes and a second, outwardly facing surface; and
    a mold resin for sealing the entire semiconductor device except for said second surface of said semiconductor element and said second surface of each said chip support, respectively, which second surfaces remain exposed.

4. A structure of a resin molded type semiconductor device having an interior sandwiched between two outer surfaces, comprising:
    a semiconductor element having a first, inwardly facing surface with a plurality of electrode pads thereon, and a second, outwardly facing surface;
    a chip support having a first surface bonded to the first surface of said semiconductor element at portions of said semiconductor element other than at said electrode pads, said chip support having a projection provided on a second surface thereof opposite to the first surface thereof; and
    a mold resin for sealing the entire semiconductor device except for said second surface of said semiconductor element and said tip of said projection of said chip support which remain exposed.

5. A structure of a resin molded type semiconductor device having an interior sandwiched between two outer surfaces, comprising:
    a semiconductor element having a first, inwardly facing surface with a plurality of electrode pads thereon, and a second, outwardly facing surface;
    a chip support having a first, inwardly facing surface face-bonded to said first surface of said semiconductor element, with an elastic adhesive layer interposed therebetween, at portions of said semiconductor element other than at said electrode pads, and a second, outwardly facing surface; and
    a mold resin for sealing the entire semiconductor device except for said second surface of said semiconductor element and said second surface of said chip support, respectively, which second surfaces remain exposed.

6. A structure of a resin molded type semiconductor device, comprising:
- a semiconductor element having a first surface with bonded pads formed thereon, and an opposite second surface;
- a plurality of inner leads respectively electrically connected to the bonding pads;
- a metal plate having a first surface bonded to said first surface of said semiconductor element at portions of said semiconductor element at which the bonding pads are not formed, and an opposite second surface; and
- a mold resin for sealing the entire semiconductor device except for said respective second surfaces of said semiconductor element and said metal plate, which second surfaces remain exposed.

7. A structure according to claim 6, wherein said metal plate comprises a radiative metal plate.

8. A structure according to claim 7, wherein said radiative metal plate is a material selected from the group consisting of Cu, Al and Cu/W.

9. A structure of a resin molded type semiconductor device, comprising:
- a semiconductor element having a first surface with bonding pads formed thereon, and an opposite second surface;
- a plurality of inner leads respectively electrically connected to the bonding pads;
- a chip support thinner in thickness than each of said inner leads, said chip support having a first surface bonded to the first surface of said semiconductor element at portions of said semiconductor element at which the bonding pads are not formed, and an opposite second surface; and
- a mold resin for sealing the entire semiconductor device except for said respective second surfaces of said semiconductor element and said chip support, which second surfaces remain exposed.

10. A structure according to claim 1, wherein said exposed second, outwardly facing surfaces of the semiconductor element and said pair of chip supports form part of the outer surfaces of the semiconductor device.

11. A structure according to claim 3, wherein said exposed second, outwardly facing surfaces of the semiconductor element and said chip supports form part of the outer surfaces of the semiconductor device.

12. A structure according to claim 5, wherein said exposed second, outwardly facing surfaces of the semiconductor element and chip support form part of the outer surfaces of the semiconductor device.

* * * * *